United States Patent
Robertson

[11] Patent Number: 5,146,650
[45] Date of Patent: Sep. 15, 1992

[54] MOLDED LATCHABLE HINGE

[75] Inventor: James W. Robertson, Oberlin, Pa.

[73] Assignee: AMP Incorporated, Harrisburg, Pa.

[21] Appl. No.: 708,401

[22] Filed: May 31, 1991

[51] Int. Cl.$^5$ .............................................. E05D 7/10
[52] U.S. Cl. ......................................... 16/259; 16/267
[58] Field of Search .................. 16/259, 257, 258, 267

[56] References Cited

U.S. PATENT DOCUMENTS

| | | | |
|---|---|---|---|
| 4,694,118 | 9/1987 | Schmidt | 174/41 |
| 4,729,059 | 3/1988 | Wang | 361/356 |
| 4,731,501 | 3/1988 | Clark et al. | 174/65 R |
| 4,741,032 | 4/1988 | Hampton | 379/399 |
| 4,749,359 | 6/1988 | White | 439/133 |
| 4,800,588 | 1/1989 | Poster, Jr. | 379/412 |
| 4,910,770 | 3/1990 | Collins et al. | 379/399 |
| 4,985,962 | 1/1991 | Weber | 16/232 |
| 5,006,077 | 4/1991 | Loose et al. | 439/409 |

FOREIGN PATENT DOCUMENTS 878545 6/1953 Fed. Rep. of Germany ........ 16/267

OTHER PUBLICATIONS

AMP Instruction Sheet IS 3217 "AMP Quiet Front Cross-Connect Terminal Closure 769147-1", Feb. 1991; AMP Incorporated, Harrisburg, Pa.
Keptel Brochure, "Keptel 1642 Protector/Terminal Closure", Nov. 1988; Keptel, Inc., Tinton Falls, N.J.
Raychem System Practice and Installation Instructions, "DTerminator TM XB2 2-Pair Cross Connect Terminal", Oct. 1990; Raychem, Menlo Park Calif.
2 Photographs of Enclosure for Cross Connect Terminal, Raychem Corporation DTerminator XB2.
AT&T Catalog "Outside Plant Systems", pp. ii, iii, 5-3, 5-4; Feb. 1987; AT&T Western Electric, Morristown, N.J.

*Primary Examiner*—John Sipos
*Assistant Examiner*—Carmine Cuda
*Attorney, Agent, or Firm*—Anton P. Ness

[57] ABSTRACT

An enclosure for terminal blocks for interconnecting conductors of multiconductor cables includes provision for two or more terminal block modules. A lid is pivotably hinged to a box-like base section, by dowels trapped in slots of hinge hooks by free ends of latch arms, with both hinge hooks and latch arms molded integrally to the rear wall of the base section. A single-piece molded clip is also defined by the hook and latch arm joined to a common base section.

4 Claims, 5 Drawing Sheets

MOLDED LATCHABLE HINGE

FIELD OF THE INVENTION

The present invention relates to the field of mechanical fastening and more particularly to hinge joints, and even more particularly to integrally molded hinge joints enabling pivoting of a lid with respect to a base.

BACKGROUND OF THE INVENTION

In the telecommunications industry telephone cable is introduced to individual telephone sites such as residences, mainly through use of a splice of the signal wires of the cable to respective house wires at a junction located outside the house. The junction is housed within a protective enclosure which is mounted usually to an outside wall of the house. One example of an assembly of a splice terminal block and enclosure therefore is sold by Raychem Corporation under the product identification D'TERMINATOR XB2 (trademark of Raychem Corporation), and the product has the capacity to crossconnect one or two separate telephone lines within the enclosure. Ends of the house cable and the drop cable from the transmission line enter the enclosure; each of the pair of signal wires of each cable is prepared to be spliced to its respective counterpart in the other cable; and the prepared wire ends are then placed within a terminal which is manipulated to penetrate the insulation of both wires to engage the conductors and thus interconnect them. Terminal blocks also provide dielectric protective structure around the splice, and together with the enclosure provide protection from the environment, especially from water, dust, and other contaminants and also from insects and animals. Such enclosures must be capable of being reopened to expose the terminal blocks for service and repair as needed. One type of terminal block for interconnecting a pair of wires is disclosed in U.S. Pat. No. 5,006,077 and discloses a tubular terminal rotatable to pierce the insulation of a pair of wire ends inserted into slots thereof to engage the conductors and thus electrically interconnect the wires.

It would be desired to provide a crossconnect enclosure which is adapted to be mounted to a vertical pole or panel and enable insertion of cables thereinto and conductors of the cables to be crossconnected in respective terminal blocks.

It would also be desirable for such enclosure to have a lid which is pivotably connected thereto and which upon being opened remains secured thereto in a position not interfering with wire termination or servicing activities within the opened enclosure.

It is desirable to provide a joint between one member and another enabling pivoting of one member with respect to the other.

It is also desirable to provide a durable hinge joint which is formed integrally to a first member to include an arcuate bearing surface enabling pivoting.

It is further desirable to provide such a hinge joint which includes an integral means for retaining a rod or rodshaped second member adjacent the arcuate bearing surface.

It is yet even further desirable to provide such a hinge joint which is moldable of plastic.

SUMMARY OF THE INVENTION

The present invention is a means for clipping onto a cylindrical rodshaped member and can be a clip mounted to a wall for holding a portion of a continuous cable. The present invention can also be considered a hinge joint comprising a hinge hook extending from a body section and defining a slot having an arcuate bearing surface for a rod or rodshaped member to extend therethrough and be rotatable with respect thereto. Adjacent the hook is a latch arm extending from the body section toward the slot to a free end proximate the arcuate bearing surface; the latch arm is deflectable toward the body section to enable insertion of a rod or rodshaped member into the slot, especially if the rod or rodshaped member is a continuous horizontally disposed article such as a cable from which it is desired to hang another member to which the hinge joint of the present invention is at least secured.

In a particular embodiment, the hinge joint of present invention is a hinge hook molded integrally to a boxlike base section of an enclosure to enable latching of a lid thereto which is pivotable between open and closed positions with respect to the base section about dowels or pins of the lid. The enclosure can be of the kind for housing one or more terminal blocks for interconnecting or crossconnecting the conductors of at least a pair of two-conductor cables such as are used in the telecommunication industry to provide telephone service to homes and individual residences and offices from a main service cable. When the base section is mounted to a vertical pole or panel, the lid pivots upwardly and remains attached and in a stable open position during installation when the cables are being interconnected, and also during servicing of the terminal blocks.

It is an objective of the invention to provide a means for securing a lid to a base wherein the lid is pivotable with respect to the base.

It is also an objective to provide a hinge joint to maintain the lid secured to the base of an enclosure when the lid had been pivoted to a stable open position after the enclosure has been mounted vertically.

It is additionally an objective to provide such a hinge joint which includes a hook moldable integrally with the base and an adjacent latch arm associated therewith also moldable integrally with the base and deflectable with respect to the base.

An embodiment of the present invention will now be described by way of example with reference to the accompanying drawings.

DETAILED DESCRIPTION OF THE PREFERRED EMBODIMENT

Figure 1:
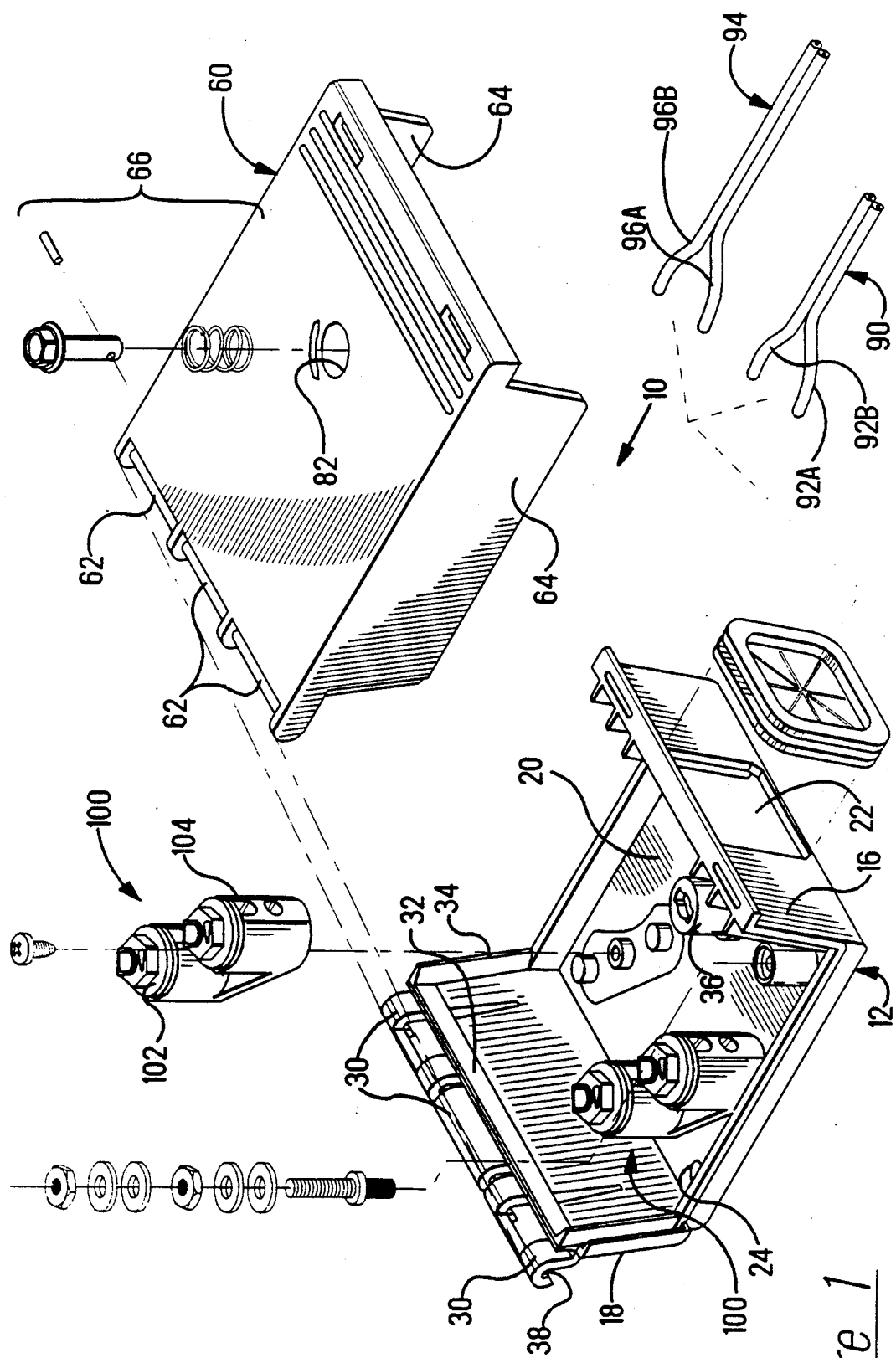
FIG. 1 is an isometric view partially exploded of an enclosure of the invention containing a pair of the terminal blocks for wires to be spliced therewithin.

Enclosure 10 in FIG. 1 is of the type disclosed in U.S. patent application Ser. No. 708,407 filed May 31, 1991 and assigned to the assignee hereof. Enclosure 10 is shown to contain two modules 100 each containing a pair of terminal blocks 102,104 of the type disclosed in U.S. patent application Ser. No. 07/708,405 filed May 31, 1991 and assigned to the assignee hereof. Enclosure 10 includes a box-like body section 12 and a lid 60 pivotably attached thereto, with body section 12 including front and rear walls 16,18 extending upwardly and angled outwardly from bottom wall 20 at an angle of about 10° from perpendicular. Drop cable 90 exits enclosure 10 at grommeted exit 22 through front wall 16 of enclosure body 12 and includes first and second insulated conductor wires 92A,92B; similarly house cable 94 exits at grommeted exit 22 and includes third and fourth conductor wires 96A,96B which are spliced with first and second wires 92A,92B respectively in terminal blocks 102,104 of one of modules 100. Enclosure body 12 has flanged mounting holes 24 through bottom wall or floor 20 enabling mounting by conventional screw fasteners 26 to a wall or to a post 98 for example, such as is shown in FIG. 2.

Figure 2:
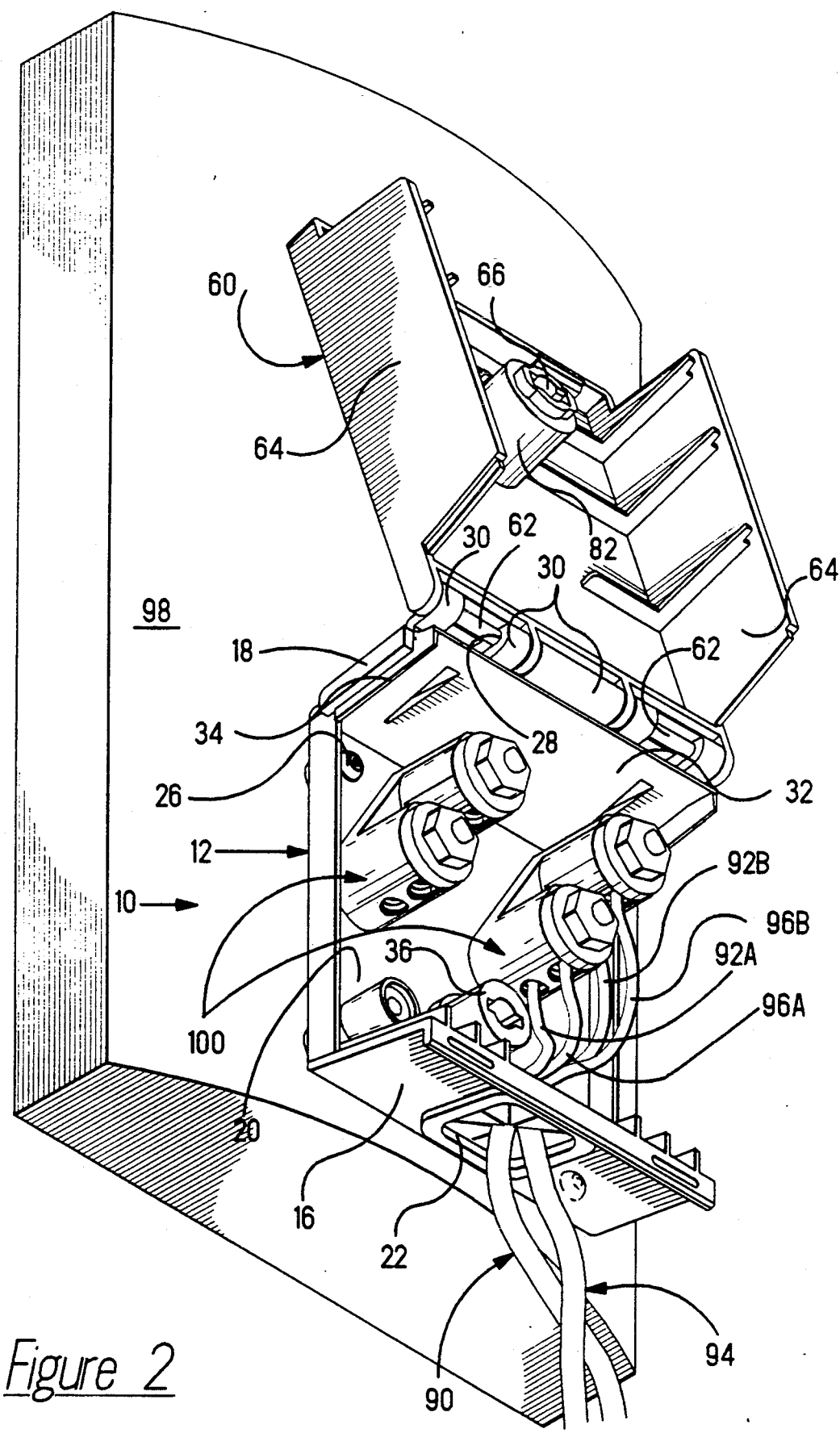
FIG. 2 is an isometric view of the enclosure mounted vertically with its lid fully opened.

Enclosure lid 60 secured to, and is pivotable with respect to body 12 by means of dowels 62 molded integrally with lid 60 and received into and held within arcuate slots 38 of hinge hooks 30 integrally molded along the upper edge 32 of rear wall 18 and aligned to define a pivot axis proximate the upper edge 32 of rear wall 18, as is discussed in greater detail with respect to FIG. 2. Lid 60 is shown to include side walls 64 for enclosure 10, permitting enclosure body 12 to be open along sides 34 thereof between front wall 16 and rear wall 18 allowing unimpeded access to terminal blocks 102,104 to facilitate splicing of the wire ends when enclosure 10 is opened. Lid 60 is locked to body section 12 into a closed position by spring-loaded lock assembly 66 secured to lid 60 and recessed within well 82 thereof; lock assembly 66 is rotatable about a quarter turn by use of a tool commonly available in the telecommunication repair and service industry, in cooperation with lock socket 36 along bottom wall 20.

FIG. 2 illustrates enclosure 10 mounted in position vertically on a pole 98, with lid 60 pivoted to a full open position. With hinge hooks 30 holding dowels 62 at the now-forwardmost upper edge 32 of back wall 18, lid 60 is pivotable overcenter to a stable rest position, allowing free access to the inside region of enclosure 10 for termination of wires 92A,96A;92B,96B and for servicing. The overcenter rest position is also assisted by the slight angle of back wall 18 sloping favorably downwardly toward floor 20 and pole 98, which also assists water runoff toward the pole and away from the front of enclosure 10 in its vertical mounted orientation. The stable overcenter open lid position is an advantage in that the lid remains open unassisted and while remaining attached to the base section when the enclosure is mounted to a vertical surface and the lid must be opened relatively upwardly.

Figure 3:
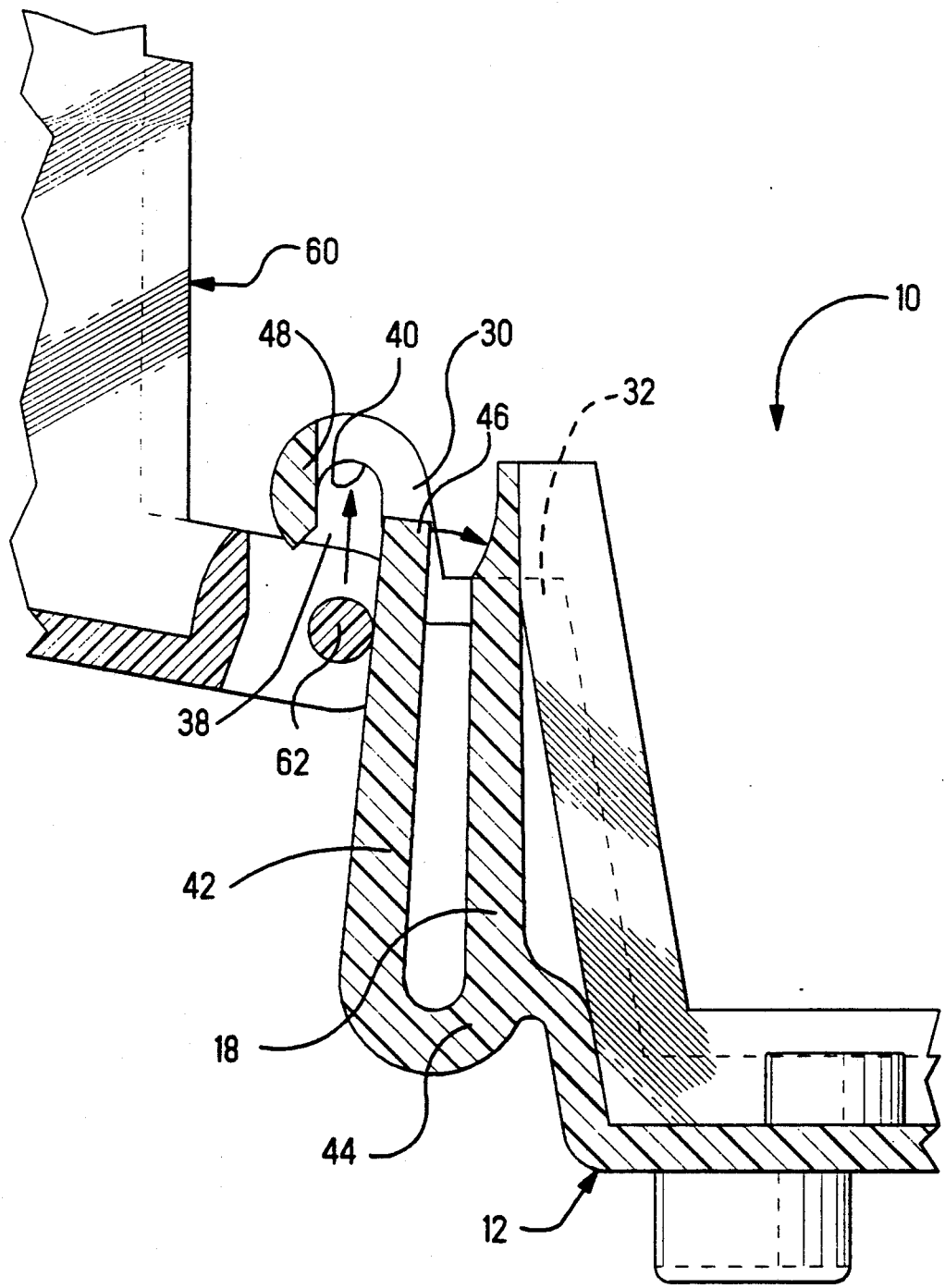
FIGS. 3 to 5 are enlarged cross-sectional views of the lid exploded from the base section, the lid in an open state and the lid in a closed state, respectively.
Figure 4:
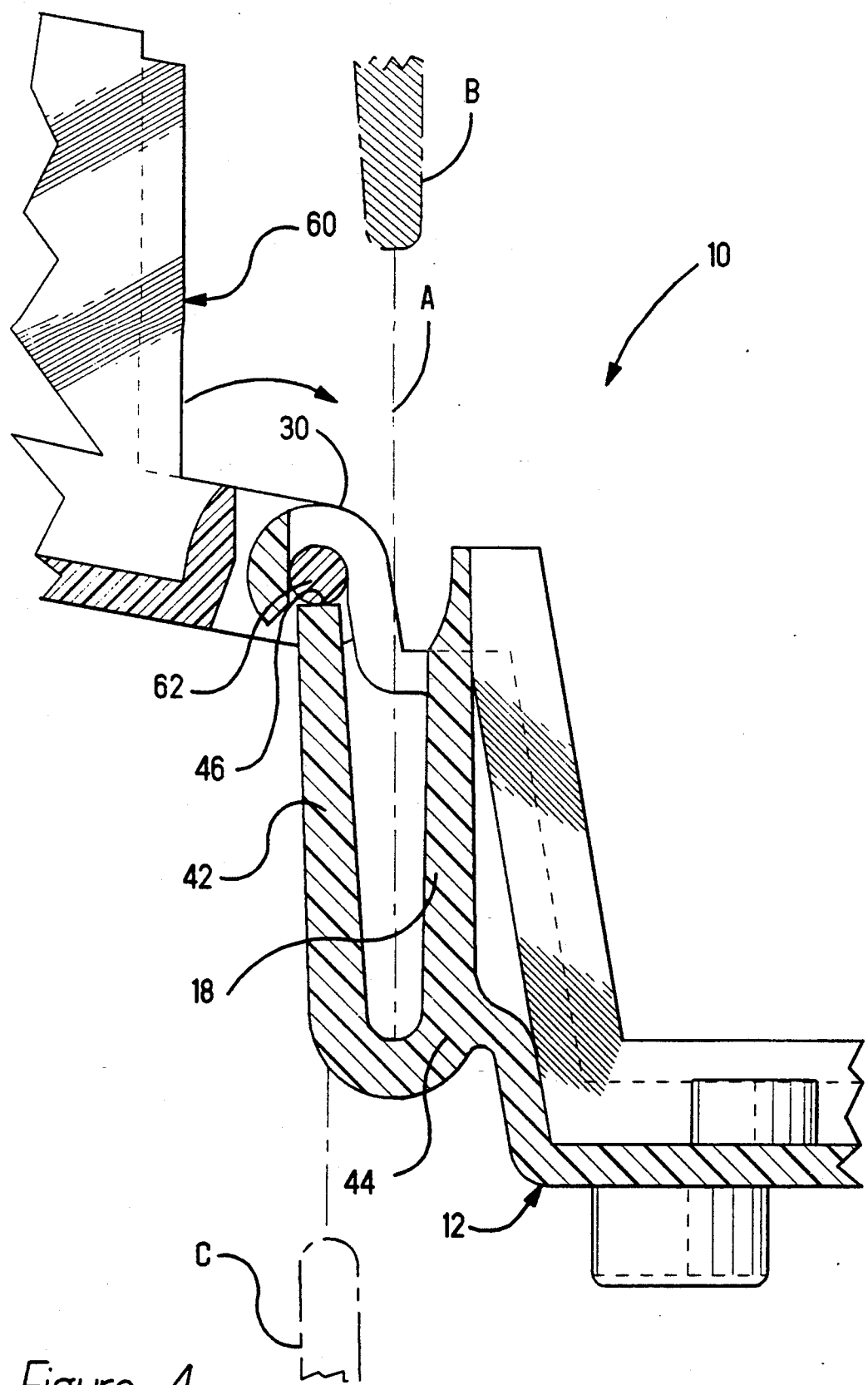
Figure 5:
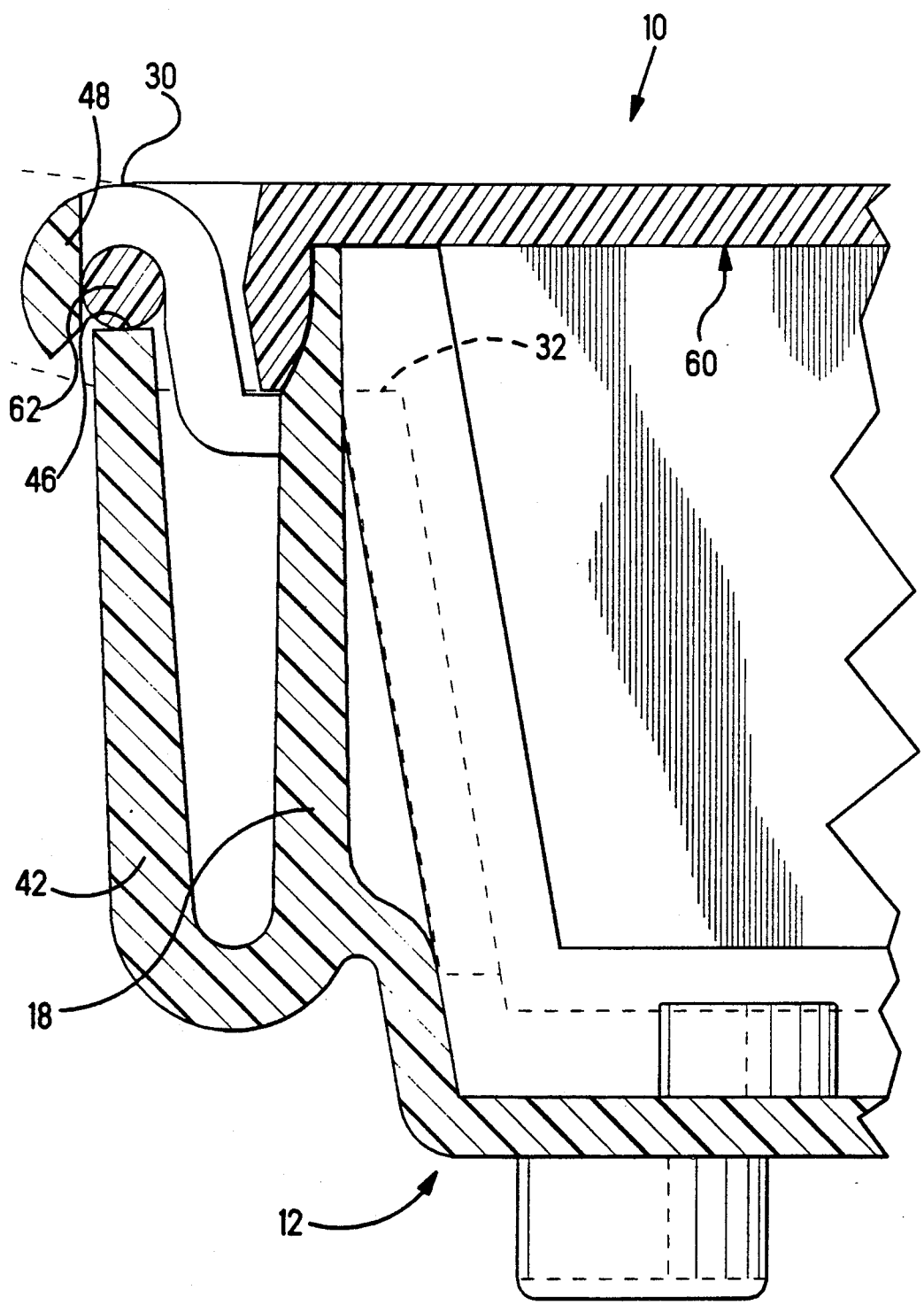

In FIGS. 3 to 5, the hinge joint of the present invention is shown to include hinge hook 30 joined to upper edge 32 of rear wall 18 of base section 12. Hinge hook 30 defines a slot 38 having an arcuate bearing surface 40 extending about a circle an arcuate distance of at least about 160° and up to about 180°, with an opening remaining comprising the remainder of the circle. Latch arm 42 extends from an integral joint 44 to rear wall 18 of base section 12 spaced from hinge hook 30 and extending theretowards to free end 46 which defines a surface substantially angularly filling the remainder of the opening of the slot. Dowel 62 is molded integrally to the rearward end of lid 60 and extends therealong, and is of a diameter corresponding to slot 38 of hook 30. In FIG. 3 lid 60 is being secured to base section 12 by its dowels 62 being urged inwardly against latch arms 42 deflecting them toward rear wall 18 as dowels 62 are slid upwardly therealong, until dowels 62 pass free ends 46 of latch arms 42 and enter slots 38 adjacent arcuate bearing surfaces 40 as shown in FIG. 4. Free ends 46 of latch arms 42 resile to closed positions entrapping dowels 62 within slots 38 and thus secure lid 60 to base section 12 without other fasteners or other means. In FIG. 5, lid 60 has been pivoted to a closed position with respect to base section 12; dowels 62 have rotated with respect to arcuate bearing surfaces 40, being held within slots 38 by free ends 46 of latch arms 42.

The integral molding of hinge hooks 30 and associated latch arms 42 is able to be easily and economically performed in a mold of the simple form of two separable mold halves. Hinge hooks 30 can be in two spaced sections on either side of latch arm 42 along the axis of slots 38, and be joined to each other at outer hood end 48. Core pins and mold cavity surfaces of the mold can form all surfaces of the hook and latch arm, including the inner arcuate surface of the slot facing one direction and the relief area between the latch arm and the wall facing the opposite direction, and be removable from the molded article simply by being moved along a single mold axis A almost parallel to the rear wall 18 in FIG. 4 facilitating the molding of base section 12.

Modifications and variations may be made to the enclosure which are within the spirit of the invention and the scope of the claims.

What is claimed is:

1. A clip comprising a body section, a hook section extending outwardly from a first end of said body section and defining a slot and having a first selected transverse dimension, and a latch arm extending from a second end of said body section toward said hook section to a free end proximate said slot and having a second selected transverse dimension less than said first selected transverse dimension, said latch arm being deflectable toward said body section; and said slot having an arcuate inner surface extending about a circle angularly at least about 160° whereby an angular opening extends about the remaining portion of said circle, and said latch arm defining a surface substantially filling said angular opening, said hook section having two portions spaced from each other a distance greater than said second transverse dimension and extending from said body section at opposed sides thereof to a common free end section extending transversely between said spaced hook portions, together defining an enclosed opening opposed from said latch arm free end whereby said latch arm is deflectable toward said body section during insertion of a transversely disposed cylindrical article into said slot through said opening and upon complete insertion said cylindrical article is held within said slot by said latch arm free end upon resiling of said latch arm, and whereby a relief region between said latch arm and said body section is easily moldable by providing access for a mold core pin extending thereinto from a direction opposite said opening and enabling said body section, said hook portions and said latch arm to be easily molded in an integral article.

2. The clip as set forth in claim 1 wherein said hook section defines a slot having an arcuate inner surface extending about a circle angularly about 180°.

3. A hinged article comprising a first section and a second section pivotably attached to said first section along a hinge axis defined by aligned slots of at least a pair of spaced apart hook sections along an edge of a wall of said first article, said first section including at least a pair of spaced apart latch arms joined to said wall at locations spaced from said pair of hook sections and extending toward openings of said slots thereof to free ends substantially filling said openings when said latch arms are undeflected, whereby corresponding dowel means of said second section are insertable into said hook sections upon deflection of said latch arms toward said wall and retained thereafter within said slots by said spaced apart latch arm free ends in a manner permitting removal therefrom if desired, and said second section is pivotable thereafter about said dowel means disposed along said hinge axis, each said hook section extending transversely a first selected dimension and each said latch arm having a transverse width extending a second selected dimension, each said hook section defining a slot having an arcuate inner surface extending about a circle angularly at least about 160° whereby an angular opening extends about the remaining portion of said circle, and each said latch arm defining a surface substantially filling a respective said angular opening, said second selected transverse dimension being less than said first selected transverse dimension, and each said hook section comprising two portions spaced from each other a distance greater than said second transverse dimension and extending from said wall at two transversely spaced locations to a common free end section extending transversely between said spaced hook portions, defining an enclosed opening opposed from said latch arm free end, whereby a relief region between each said latch arm and said wall is easily moldable by providing access for a mold core pin extending thereinto from a direction opposite said opening and enabling said first section, said hook portions and said latch arms to be easily molded in an integral member.

4. The hinged article as set froth in claim 3 wherein each said hook section defines a slot having an arcuate inner surface extending about a circle angularly about 180°.

* * * * *